(12) United States Patent
Zeisel (10) Patent No.: US 11,011,573 B2
(45) Date of Patent: May 18, 2021

(54) RADIATION-EMITTING COMPONENT

(71) Applicant: OSRAM Opto Semiconductors GmbH, Regensburg (DE)

(72) Inventor: Roland Zeisel, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/608,455

(22) PCT Filed: May 28, 2018

(86) PCT No.: PCT/EP2018/063935
§ 371 (c)(1),
(2) Date: Oct. 25, 2019

(87) PCT Pub. No.: WO2018/219868
PCT Pub. Date: Dec. 6, 2018

(65) Prior Publication Data
US 2020/0203421 A1  Jun. 25, 2020

(30) Foreign Application Priority Data
May 29, 2017 (DE) ..................... 10 2017 111 602.8

(51) Int. Cl.
*H01L 27/15* (2006.01)
*H01L 29/20* (2006.01)
*H01L 29/778* (2006.01)
*H01L 33/30* (2010.01)

(52) U.S. Cl.
CPC ........ *H01L 27/156* (2013.01); *H01L 29/2003* (2013.01); *H01L 29/778* (2013.01); *H01L 33/30* (2013.01)

(58) Field of Classification Search
None
See application file for complete search history.

(56) References Cited

U.S. PATENT DOCUMENTS

2014/0008667 A1   1/2014 Lau et al.
2020/0258937 A1*  8/2020 Long ................ H01L 29/78675

FOREIGN PATENT DOCUMENTS

JP            10-270753 A      10/1998

* cited by examiner

*Primary Examiner* — Thien F Tran
(74) *Attorney, Agent, or Firm* — DLA Piper LLP (US)

(57) ABSTRACT

A radiation-emitting component includes a semiconductor layer sequence including first and second semiconductor layers, and an active region and is arranged between the first and second semiconductor layers, first and second electrodes electrically connect to the first and second semiconductor layers, a semiconductor layer sequence generates electromagnetic radiation depending on a current flow between the first and second electrodes, a driver field-effect transistor includes at least one driver gate and at least one driver channel, the second electrode and the driver channel electrode separately electrically connect to the driver channel and the driver gate electrode electrically connects to the driver gate, and the driver field-effect transistor is configured to control a current flow between the driver channel electrode and the second electrode through the driver channel and thereby the current flow between the first and second electrodes, depending on a voltage applied to the driver gate electrode.

20 Claims, 3 Drawing Sheets

RADIATION-EMITTING COMPONENT

TECHNICAL FIELD

This disclosure relates to a radiation-emitting component and a display device.

BACKGROUND

The term video screen, video wall, LED screen or LED wall is a collective term for large display panels. These display panels often have a large number of radiation-emitting components such as differently colored light-emitting diodes (LEDs) with which discrete pixels are represented. Up to now, the LEDs have usually been controlled sequentially by a driver (so-called "passive matrix operation"). However, passive matrix operation has proved problematic for higher pixel numbers or pixel densities.

It could therefore be helpful to provide a radiation-emitting component and a display device that can be manufactured efficiently and enables a high number and density of pixels in a simplified manner, respectively.

SUMMARY

I provide a radiation-emitting component including at least one semiconductor layer sequence, at least one first and at least one second electrode and at least one driver field-effect transistor, at least one driver channel electrode, and at least one driver gate electrode, wherein the semiconductor layer sequence includes at least one first semiconductor layer, at least one second semiconductor layer and at least one active region that generates electromagnetic radiation and arranged between the first and second semiconductor layers, the first electrode electrically connects to the first semiconductor layer and the second electrode electrically connects to the second semiconductor layer, the semiconductor layer sequence is configured to generate electromagnetic radiation depending on a current flow between the first and second electrodes, the driver field-effect transistor includes at least one driver gate and at least one driver channel, the second electrode and the driver channel electrode separately electrically connect to the driver channel and the driver gate electrode electrically connects to the driver gate, and the driver field-effect transistor is configured to control a current flow between the driver channel electrode and the second electrode through the driver channel and thereby the current flow between the first and second electrodes, depending on a voltage applied to the driver gate electrode.

I also provide a display device including a plurality of the radiation-emitting component including at least one semiconductor layer sequence, at least one first and at least one second electrode and at least one driver field-effect transistor, at least one driver channel electrode, and at least one driver gate electrode, wherein the semiconductor layer sequence includes at least one first semiconductor layer, at least one second semiconductor layer and at least one active region that generates electromagnetic radiation and arranged between the first and second semiconductor layers, the first electrode electrically connects to the first semiconductor layer and the second electrode electrically connects to the second semiconductor layer, the semiconductor layer sequence is configured to generate electromagnetic radiation depending on a current flow between the first and second electrodes, the driver field-effect transistor includes at least one driver gate and at least one driver channel, the second electrode and the driver channel electrode separately electrically connect to the driver channel and the driver gate electrode electrically connects to the driver gate, and the driver field-effect transistor is configured to control a current flow between the driver channel electrode and the second electrode through the driver channel and thereby the current flow between the first and second electrodes, depending on a voltage applied to the driver gate electrode, arranged in rows and columns in a matrix including one data line per column and one switching line per row, and a first and second supply line, wherein each of the radiation-emitting components is electrically coupled to the respective switching line by its switching gate electrode, the respective data line by its first switching channel electrode, the first supply line by its first electrode, and the second supply line by its driver channel electrode.

I further provide a radiation-emitting component including at least one semiconductor layer sequence, at least one first and at least one second electrode and at least one driver field-effect transistor, at least one driver channel electrode and at least one driver gate electrode, wherein the semiconductor layer sequence includes at least one first semiconductor layer, at least one second semiconductor layer and at least one active region that generates electromagnetic radiation and arranged between the first and second semiconductor layers, the first electrode electrically connects to the first semiconductor layer and the second electrode electrically connects to the second semiconductor layer, the semiconductor layer sequence is configured to generate electromagnetic radiation depending on a current flow between the first and second electrodes, the driver field-effect transistor includes at least one driver gate and at least one driver channel, the second electrode and the driver channel electrode separately electrically connect to the driver channel and the driver gate electrode electrically connects to the driver gate, the driver field-effect transistor is configured to control a current flow between the driver channel electrode and the second electrode through the driver channel and thereby the current flow between the first and second electrodes, depending on a voltage applied to the driver gate electrode, and the radiation-emitting component includes a switching field-effect transistor, and the semiconductor layer sequence, the driver field-effect transistor and the switching field-effect transistor form a monolithic unit.

I also further provide a radiation-emitting component including at least one semiconductor layer sequence, at least one first and at least one second electrode and at least one driver field-effect transistor, at least one driver channel electrode and at least one driver gate electrode, wherein the semiconductor layer sequence includes at least one first semiconductor layer, at least one second semiconductor layer and at least one active region that generates electromagnetic radiation and arranged between the first and second semiconductor layers, the first electrode electrically connects to the first semiconductor layer and the second electrode electrically connects to the second semiconductor layer, the semiconductor layer sequence is configured to generate electromagnetic radiation depending on a current flow between the first and second electrodes, the driver field-effect transistor includes at least one driver gate and at least one driver channel, the second electrode and the driver channel electrode separately electrically connect to the driver channel and the driver gate electrode electrically connects to the driver gate, and the driver field-effect transistor is configured to control a current flow between the driver channel electrode and the second electrode through the driver channel and thereby the current flow between the first and second electrodes, depending on a voltage applied to the driver gate electrode, and including at least one capacitor electrode electrically insulated from the driver gate electrode and arranged such that the capacitor electrode forms, together with the driver gate electrode, a capacitor having a predetermined electrical capacitance.

LIST OF REFERENCE SIGNS 1 component
10 LED layer sequence
11 first electrode
12 first semiconductor layer
13 active layer
14 second semiconductor layer
15 second electrode
20 driver field-effect transistor
22 driver gate
23 driver channel
24 driver channel electrode
25 driver gate electrode
26 dielectric
27 capacitor electrode
28 electron gas
29 buffer
30 capacitor
40 switching field-effect transistor
41 first switching channel electrode
42 switching gate
43 switching channel
44 second switching channel electrode
45 switching gate electrode
50 carrier
60 carrier
D data line
R switching line
first supply line
Gnd second supply line
I current flow

DETAILED DESCRIPTION

I provide a radiation-emitting component. The radiation-emitting component is a light-emitting diode chip, for example. For example, the radiation-emitting component may be a thin film LED chip free of a growth substrate for a semiconductor layer sequence.

The radiation-emitting component is particularly suitable for being used in an above-mentioned display device such as a video screen. The component can be designed to emit colored light, for example, as a red (R) LED, blue (B) LED or green (G) LED. The use of additional white (W) LEDs is also possible. For example, the radiation-emitting component may be assigned to one pixel or one subpixel of the display device.

The radiation-emitting component extends in a vertical direction between a first main plane and a second main plane, the vertical direction being transverse or perpendicular to the first and/or second main plane. The main planes may, for example, be the main extension planes on the bottom surface and the top surface of the radiation-emitting component. The radiation-emitting component extends parallel or essentially parallel to the main planes in a planar manner, for example. This extension will be referred to as the lateral extension or direction in the following. For example, the radiation-emitting component has a thickness in the vertical direction that is small compared to a maximum extension of the radiation-emitting component in the lateral direction.

Advantageously, the radiation-emitting component may comprise a semiconductor layer sequence as well as a first and a second electrode. The semiconductor layer sequence may comprise a first semiconductor layer, a second semiconductor layer, and an active region that generates electromagnetic radiation and arranged between the first and second semiconductor layers. The first electrode may electrically connect to the first semiconductor layer and the second electrode may electrically connect to the second semiconductor layer. The semiconductor layer sequence may be configured to generate electromagnetic radiation depending on a current flow between the first and second electrodes and is hereinafter referred to as the LED layer sequence.

The LED layer sequence extends parallel to the main planes in a planar manner at least in places. For example, a layer of the LED layer sequence forms the first main plane of the radiation-emitting component, for example, the bottom surface of the radiation-emitting component. The LED layer sequence can be epitaxially grown on a growth substrate. The above-mentioned vertical direction then corresponds to the growth direction, for example.

For example, the LED layer sequence, in particular the active region, contains a III-V compound semiconductor material. III-V compound semiconductor materials are particularly suitable for radiation generation in the ultraviolet ($Al_x In_y Ga_{1-x-y} N$), visible ($Al_x In_y Ga_{1-x-y} N$, especially for blue to green radiation, or $Al_x In_y Ga_{1-x-y} P$, especially for yellow to red radiation) and infrared ($Al_x In_y Ga_{1-x-y} As$) spectral ranges. In each example, the following applies: $0 \leq x \leq 1$, $0 \leq y \leq 1$ and $x+y \leq 1$, in particular with $x \neq 1$, $y \neq 1$, $x \neq 0$ and/or $y \neq 0$. III-V compound semiconductor materials, in particular from the material systems mentioned, can also achieve high internal quantum efficiencies in radiation generation.

The first semiconductor layer and the second semiconductor layer expediently are of different conductivity types. In particular, the first semiconductor layer may be a p-doped semiconductor layer and the second semiconductor layer an n-doped semiconductor layer.

The first electrode, for example, extends laterally along the first semiconductor layer and contacts it electrically. In particular, the first electrode extends in a planar manner on a side of the first semiconductor layer facing away from the second semiconductor layer. The first electrode, for example, can also be referred to as the p-connection layer. In particular, the first electrode comprises or consists of a metal.

The first electrode may be reflective to the radiation emitted by the active layer, for example, to reflect radiation emitted in the direction of the second main plane towards a radiation exit surface of the radiation-emitting component. The first electrode can in particular be designed as a reflective contact layer and preferably contain silver or aluminum. Alternatively, the first electrode can be transparent, for example. In particular, the first contact layer may contain a transparent conductive oxide (TCO) for this purpose. Transparent conductive oxides are transparent conductive materials, usually metal oxides such as zinc oxide, tin oxide, cadmium oxide, titanium oxide, indium oxide or indium tin oxide (ITO).

The second electrode, for example, is applied in a lateral edge region of the second semiconductor layer and contacts it electrically. In this context, the second semiconductor layer, for example, has a lateral protrusion with respect to the first semiconductor layer in which the second semiconductor layer is electrically contacted by the second electrode. The second electrode, for example, can also be referred to as the n-connection layer. In particular, the second electrode comprises or consists of a metal.

The second electrode may be reflective to the radiation emitted by the active region, for example, to reflect it towards a radiation exit surface of the radiation-emitting component. The second electrode can in particular be designed as a reflective contact layer and preferably contain silver or aluminum. Alternatively, the second electrode can be transparent, for example. In particular, the second electrode may contain a transparent conductive oxide for this purpose.

Several corresponding first semiconductor layers and/or second semiconductor layers and/or active regions and/or first electrodes and/or second electrodes can be provided.

Advantageously, the radiation-emitting component may comprise a driver field-effect transistor (driver FET), a driver channel electrode, and a driver gate electrode. The driver FET may comprise a driver gate and a driver channel. The second electrode and the driver channel electrode may separately electrically connect to the driver channel and the driver gate electrode may electrically connect to the driver gate. The driver FET may be configured to control a current flow between the driver channel electrode and the second electrode through the driver channel and thereby the current flow between the first and second electrodes, depending on a voltage applied to the driver gate electrode. The second electrode thus serves as the second driver channel electrode of the driver FET.

The driver FET can at least in places extend parallel to the main planes in a planar manner. For example, the driver FET forms the second main plane of the radiation-emitting component, for example, the top surface of the radiation-emitting component. The driver FET may be grown epitaxially on a growth substrate. In particular, the driver FET can extend laterally at least in places along the LED layer sequence, for example, on a side of the second semiconductor layer facing away from the first semiconductor layer along the second semiconductor layer. As an example, the driver FET has a protrusion in the lateral direction with respect to the second semiconductor layer intended for electrical contacting. In particular, the driver FET in this context forms a layer stack with the LED layer sequence. For example, the driver FET contains a III-V compound semiconductor material such as $Al_x Ga_{1-x} N$, $Al_x In_y Ga_{1-x-y} P$, $Al_x Ga_{1-x} As$, with $0<x\leq1$, $0\leq y\leq1$ and $x+y\leq1$. In particular, the driver FET may be a so-called junction field-effect transistor such as a high-electron-mobility transistor (HEMT).

The driver channel is then arranged, for example, between semiconductor layers with different band gaps. A driver channel is defined as a current-carrying part of the driver FET between the driver channel electrode and the second electrode, wherein the current flow can be controlled by a voltage applied to the driver gate electrode. If the driver FET is designed as a HEMT, the driver channel is exemplarily formed at the interface between an undoped semiconductor layer with a lower bandgap and a semiconductor layer with a higher bandgap.

The driver channel electrode contacts the driver channel electrically. The driver channel electrode can also be referred to as a drain or source connection, for example. In particular, the first electrode comprises or consists of a metal.

The second electrode also contacts the driver channel electrically separately from the driver channel electrode. In this context, the second electrode can also be referred to as a source or drain connection, for example. The second electrode can extend from a lateral edge region of the second semiconductor layer in the vertical direction towards the driver channel, for example, towards a protrusion of the driver channel in the lateral direction with respect to the second semiconductor layer.

In particular, the driver FET is serially connects to the LED layer sequence such that a current flow through the driver channel essentially corresponds to a current flow through the LED layer sequence. In particular, the radiation-emitting component or driver FET is configured such that the current flow through the LED layer sequence can be adjusted depending on a voltage applied to the driver gate electrode.

Several corresponding driver field-effect transistors and/or driver channel electrodes and/or driver gate electrodes and/or driver gates and/or driver channels can be provided.

Advantageously, the radiation-emitting component may comprise an LED layer sequence, first and second electrodes, as well as a driver FET, a driver channel electrode and a driver gate electrode.

The LED layer sequence comprises a first semiconductor layer, a second semiconductor layer, and an active region that generates electromagnetic radiation and arranged between the first and second semiconductor layers. The first electrode electrically connects to the first semiconductor layer and the second electrode electrically connects to the second semiconductor layer. The LED layer sequence is configured to generate electromagnetic radiation depending on a current flow between the first and second electrodes.

The driver FET has a driver gate and a driver channel. The second electrode and the driver channel electrode separately electrically connect to the driver channel and the driver gate electrode electrically connects to the driver gate. The driver FET is configured to control a current flow between the driver channel electrode and the second electrode through the driver channel and thereby the current flow between the first and second electrodes, depending on a voltage applied to the driver gate electrode.

For example, the LED layer sequence and driver FET can be stacked in the vertical direction. In particular, the LED layer sequence and the driver FET can be epitaxially deposited on a common growth substrate. In other words, the LED layer sequence and the driver FET can form a monolithic unit or be integrated jointly into the radiation-emitting component. In an example of the radiation-emitting component, the semiconductor layer sequence and the driver field-effect transistor are epitaxially deposited on a common growth substrate, the semiconductor layer sequence and the driver field-effect transistor are grown in a stacked manner on top of each other at least in places.

Since the radiation-emitting component is coupled to the driver FET, a current flow through the LED layer sequence can be specifically adjusted. In particular, several such radiation-emitting components of a display device can be permanently coupled with a common supply voltage so that a homogeneous luminance can be achieved even at high pixel numbers and pixel densityes.

Since the driver FET is integrated into the radiation-emitting component, there is no need for a driver FET arranged externally to the radiation-emitting component. In particular, in this context it is not necessary to arrange the radiation-emitting component on a so-called backplane comprising an external driver FET intended to drive the radiation-emitting component. Such backplanes can be used in conjunction with AMOLED display devices, for example, where silicon thin-film technology is usually used ("TFT array" or "TFT backplane"). By integrating the driver FET into the radiation-emitting component, a combination of several technologies (silicon thin-film with LED) can be advantageously dispensed with when manufacturing a display device. The advantage of this is that it contributes to the creation of a radiation-emitting component and a display device that can be manufactured efficiently and enables a high pixel number and density, respectively.

Further advantageously, the radiation-emitting component may comprise one or more capacitor electrodes embodied in an electrically insulated manner from the driver gate electrode and arranged such that the capacitor electrode forms, together with the driver gate electrode, a capacitor having a predetermined electrical capacitance.

The capacitor electrode, for example, can be spaced from the driver gate electrode in the vertical direction. In particular, the resulting capacitor, the driver FET and the LED layer sequence can form a monolithic unit or be integrated jointly into the radiation-emitting component.

Advantageously, a capacitor arranged externally to the radiation-emitting component or a backplane equipped with the external capacitor can be dispensed with. In particular, the capacitor can be used for active matrix operation of the radiation-emitting component in a display device.

Advantageously, the capacitor electrode may electrically connect to or be formed by the first electrode.

Advantageously, this enables a particularly compact design of the radiation-emitting component.

Further advantageously, the capacitor may be configured to maintain the voltage applied to the driver gate electrode for a predetermined period of time such that the current flow between the driver channel electrode and the second electrode through the driver channel and thereby the current flow between the first and second electrodes is constant or substantially constant.

Advantageously, a dielectric may be arranged between the capacitor electrode and the driver gate electrode.

The dielectric comprises at least one dielectric or electrically insulating layer, for example, of silicon oxide, silicon nitride, aluminum oxide. In particular, the dielectric extends completely into a space between the capacitor electrode and the driver gate electrode. The dielectric can also be used to electrically insulate the contacts of the driver FET and/or the LED layer sequence.

Advantageously, the dielectric may comprise or consist of a high-k dielectric. A high-k dielectric is a material having a higher dielectric constant $\varepsilon_r$ than conventional silicon dioxide ($\varepsilon_r$=3.9) such as $HfO_2$.

Advantageously, the radiation-emitting component may comprise one or more switching field-effect transistors (switching FETs), one or more switching gate electrodes, and one or more first and second switching channel electrodes. The switching FET has one or more switching gates and one or more switching channels.

The first switching channel electrode and the second switching channel electrode separately electrically connect to the switching channel and the switching gate electrode electrically connects to the switching gate. The second switching channel electrode also electrically connects to the driver gate electrode.

The switching FET is configured to switch a voltage applied to the first switching channel electrode through to the second switching channel electrode depending on a voltage applied to the switching gate electrode. As an example, a current flowing as a result can be used to charge or discharge the aforementioned capacitor.

The switching FET can be set up analog to the driver FET. For example, the LED layer sequence and the switching FET can be stacked in the vertical direction. In particular, the LED layer sequence and the switching FET can be epitaxially deposited on a common growth substrate. As an example, the switching FET is arranged laterally adjacent to the driver FET for this purpose. In other words, the LED layer sequence, the driver FET and the switching FET can form a monolithic unit or be integrated jointly into the radiation-emitting component.

Since the radiation-emitting component is coupled to the switching FET, a current flow through the LED layer sequence can be specifically adjusted. In particular, such a radiation-emitting component of a display device can be switched individually. In combination with a capacitor configured to maintain the voltage applied to the driver gate electrode for a predetermined period of time, the radiation-emitting component can be operated in an active matrix mode in a display device.

By integrating the switching FET into the radiation-emitting component, a switching FET arranged externally to the radiation-emitting component or a backplane equipped with the external switching FET can be advantageously dispensed with.

Advantageously, the switching FET may be configured to control a capacitor charging process depending on the voltage applied to the switching gate electrode.

In this context, the capacitor is coupled to the switching FET by one of its electrodes, for example, while its other electrode can be coupled to a voltage source. In particular, the capacitor is coupled to the switching FET such that a voltage level applied to the electrode of the capacitor can be adjusted depending on the voltage applied to the switching gate electrode.

Advantageously, the driver FET and/or the switching FET may be a junction field-effect transistor. In particular, this may be a HEMT.

Advantageously, the LED layer sequence, in particular the active region, may be based on at least one of the material systems: $Al_x In_y Ga_{1-x-y} N$, $Al_x In_y Ga_{1-x-y} P$, $Al_x In_y Ga_{1-x-y} As$, in each example with $0 \le x \le 1$, $0 \le y \le 1$ and $x+y \le 1$.

Advantageously, the driver and/or the switching FET may be based on at least one of the material systems: $Al_x Ga_{1-x} N$, $Al_x In_y Ga_{1-x-y} P$, $Al_x Ga_{1-x} As$, in each example with $0 \le x \le 1$, $0 \le y \le 1$ and $x+y \le 1$.

Advantageously, the driver gate and/or switching gate may comprise an insulation layer in direct contact with the gate electrode. For example, this can be an SiN layer.

Advantageously, the LED layer sequence, in particular the active region, may contain or consist of $Al_x In_y Ga_{1-x-y} N$. At the same time, the driver and/or the switching field-effect transistor contains or consists of $Al_x Ga_{1-x} N$, in each example with $0 \leq x \leq 1$, $0 \leq y \leq 1$ and $x+y \leq 1$.

Advantageously, the LED layer sequence, in particular the active region, may contain or consist of $Al_x In_y Ga_{1-x-y} P$. At the same time, the driver field-effect transistor and/or the switching field-effect transistor may contain or consist of $Al_x Ga_{1-x} As$, in each example with $0 \leq x \leq 1$, $0 \leq y \leq 1$ and $x+y \leq 1$.

Advantageously, the LED layer sequence, in particular the active region, may contain or consist of $Al_x In_y Ga_{1-x-y} P$. At the same time, the driver field-effect transistor and/or the switching field-effect transistor may contain or consist of $Al_x In_y Ga_{1-x-y} P$, in each example with $0 \leq x \leq 1$, $0 \leq y \leq 1$ and $x+y \leq 1$.

For a radiation-emitting component with an LED layer sequence based on an $Al_x In_y Ga_{1-x-y} N$ material system, AlGaN/GaN, for example, is suitable as the material for the driver FET and/or switching FET.

For a radiation-emitting component with an LED layer sequence based on an $Al_x In_y Ga_{1-x-y} P$ material system, AlGaAs/GaAs, for example, is suitable as the material for the driver FET and/or switching FET. To reduce absorption of the radiation generated by the LED layer sequence by the driver FET and/or switching FET, for example, the FET can be ablated in an area of the radiation exit surface of the LED layer sequence. For example, the driver FET and/or switching FET in this context shows etching traces on its lateral side surfaces.

For a radiation-emitting component with an LED layer sequence based on an $Al_x In_y Ga_{1-x-y} P$ material system, for example, it is also possible to form the driver FET and/or switching FET from layers that are transparent to radiation generated by the LED layer sequence such as red light. In particular, it is possible to use AlGaP/GaP as material for the driver FET and/or switching FET.

Advantageously, the driver FET and/or switching FET is structured such that there is no material of the driver FET and switching FETs perpendicular to the main extension direction of the LED layer sequence. In particular, the driver FET and/or switching FET may be ablated in this area and show traces of ablation on its side surface.

Advantageously, an absorption of the radiation generated by the LED layer sequence due to the driver FET and/or switching FET can thus be avoided.

The second semiconductor layer may have a lateral protrusion with respect to the first semiconductor layer and the active region, the protrusion being at least partially covered by the second electrode.

I also provide a display device comprising a plurality of radiation-emitting components according to the first aspect arranged in rows and columns in a matrix-like manner, one data line per column and one switching line per row, and a first and second supply line. Each of the radiation-emitting components is electrically coupled to the respective switching line by its switching gate electrode, the respective data line by its first switching channel electrode, the first supply line by its first electrode, and the second supply line by its driver channel electrode.

Advantageously, the display device enables active matrix operation and thus higher pixel numbers and/or pixel densities compared to display devices in passive matrix operation. In particular, the display device may comprise more than 16×16×3 radiation-emitting components (e.g., one red, one green and one blue radiation-emitting component each in height by width). As an example, the radiation-emitting components are arranged on an area of approx. $2 \times 2 \ cm^2$.

Since the display device comprises radiation-emitting components in which a driver FET is already integrated, it is advantageous to dispense with driver FETs arranged externally with respect to the radiation-emitting components or with a backplane equipped with the external driver FETs. The display device can therefore be manufactured efficiently in an advantageous manner.

Further advantages will become apparent from the examples which will be explained in more detail in the following in conjunction with the schematic drawings.

Identical or similar elements as well as elements of equal function are designated with the same reference signs in the figures. The figures and the proportions of the elements depicted in the figures are not to be regarded as true to scale. Rather, individual elements and in particular layer thicknesses may be represented disproportionately large for better representability and/or better understanding.

The duration of an applied control voltage of a pixel of a passive matrix decreases with increasing number of rows and columns of a pixel matrix. Therefore, passive matrices are limited in size. To increase the pixel density in future video walls, for example, in so-called Nar-rowPixelPitch LED video walls, it is therefore proposed to actively control individual radiation-emitting components such as LEDs of a display device, similar to today's active matrix displays.

To perform an active matrix operation of the LEDs, for example, two field-effect transistors (FETs) and a capacitor can be assigned to each color of each pixel. In AMOLED displays, these components are manufactured in silicon thin-film technology ("TFT array" or "TFT backplane").

In contrast, video walls have exactly one LED assigned to each pixel or color of a pixel, i.e., the pixels are designed as single LEDs and not LCD backlit by LEDs. To operate the individual LEDs similarly to today's active matrix displays, they can be mounted on such a TFT backplane and connected accordingly.

The following examples will explain how video walls designed for active matrix operation can do without a combination of different technologies (silicon thin film with LED) to ensure their efficient production.

Figure 1:
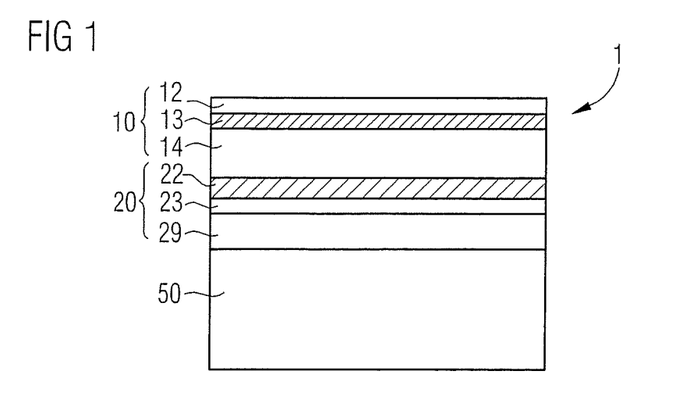
FIG. 1 shows a first example of a radiation-emitting component in a schematic sectional view.

FIG. 1 shows a first example of a radiation-emitting component 1 in a schematic sectional view. The component 1 in particular has an LED layer sequence 10 that generates electromagnetic radiation. The radiation-emitting component 1, for example, is a so-called "flipchip." Other examples may also be a thin-film LED chip in which a growth substrate has been removed.

In this examples, the LED layer sequence 10 is based, for example, on GaN and comprises a p-doped first semiconductor layer 12, an n-doped second semiconductor layer 14 and an active region 13 arranged between the two semiconductor layers 12, 14. Deviating from this, the LED layer sequence 10, in particular the active region 13, may contain one of the compound semiconductor materials mentioned in the general part of the description.

The component 1 also comprises a FET 20 with a gate layer 22 and a channel layer 23. In this example, the FET 20 is formed as a HEMT in which the gate layer 22 is based on AlGaN and the channel layer 23 is formed between an undoped buffer layer of GaN and the gate layer 22. The gate layer 22 or part of the channel layer 23 is n-doped here as an example. The gate layer 22 is in direct contact with the second semiconductor layer 14 at least in places. As an example, the gate layer 22 comprises an SiN layer intended for electrical contacting of the gate layer 22.

In this example, the component 1 finally has a sapphire growth substrate 50 on which the FET 20 and the LED layer sequence 10 are jointly epitaxially deposited. As shown, the FET 20 and the LED layer sequence 10 are grown in a stacked manner on top of each other at least in places.

Figure 2:
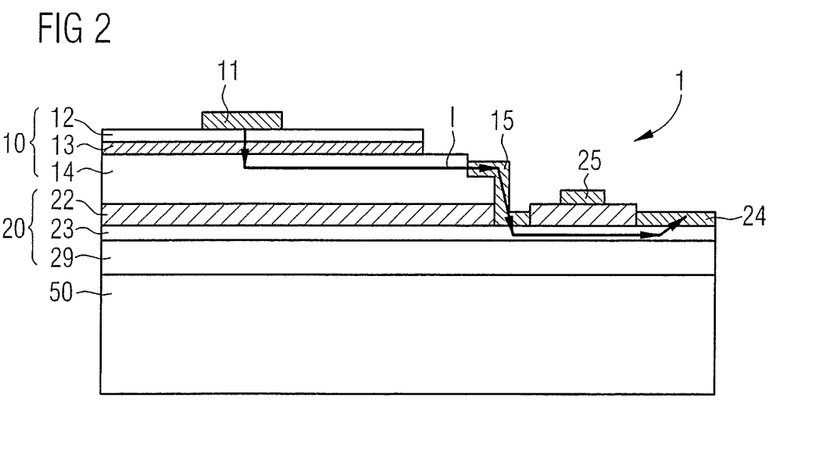
FIG. 2 shows a second example of a radiation-emitting component in a schematic sectional view.

In a second example as shown in FIG. 2, the component 1 is supplemented by an electrical contact compared to the first example.

In particular, the component 1 has a first electrode 11 and a second electrode 15 through which a voltage can be applied to the LED layer sequence 10 and a current flow I can be caused through the LED layer sequence 10 to put the component 1 into radiation-emitting operation.

The first electrode 11 extends at least in places over the first semiconductor layer 12. The second electrode 15 is exemplarily arranged in a lateral edge region, in particular on a side surface of the second semiconductor layer 14, and extends in particular through the gate layer 22 to the channel layer 23.

Laterally spaced from the second electrode 15 and through at least a portion of the gate layer 22, a channel electrode 24 is further provided which electrically contacts the channel layer 23. A gate electrode 25 contacts this portion of the gate layer 22 electrically so that the current flow I between the second electrode 15 and the channel electrode 24 can be adjusted depending on a voltage applied to the gate electrode 25. In this context, the second electrode 15 and the channel electrode 24 can also be referred to as the drain and source of the FET 20, respectively.

Figure 6:
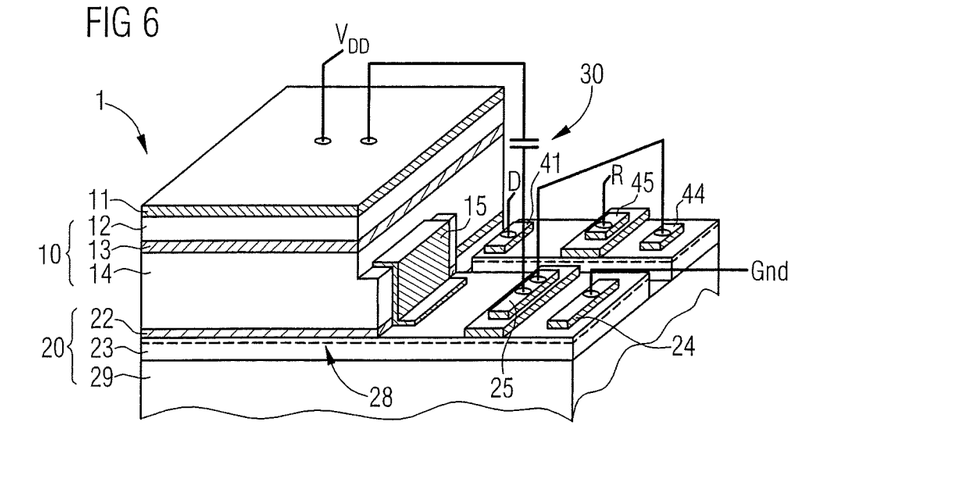
FIG. 6 shows a fifth example of a radiation-emitting component in a schematic perspective view.
Figure 7:
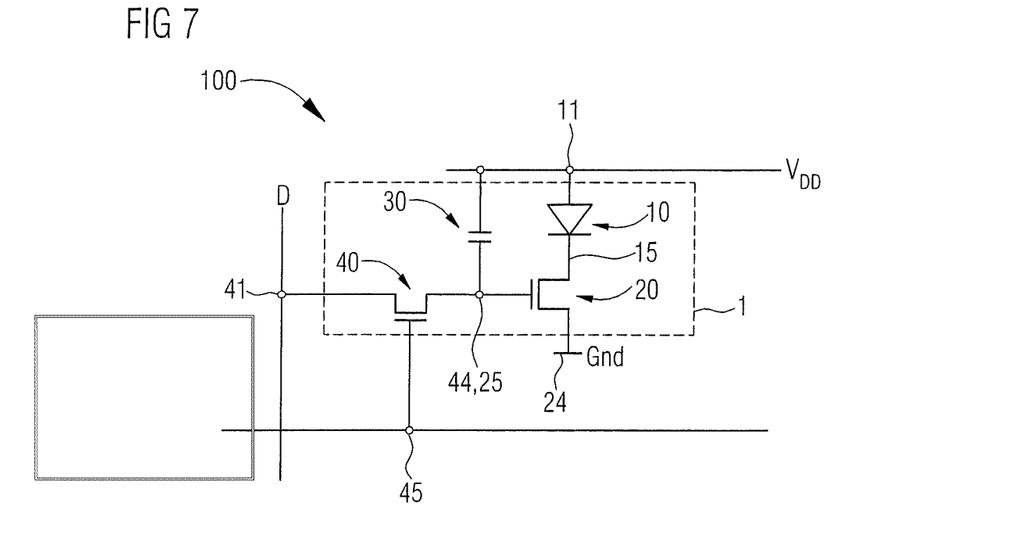
FIG. 7 shows a schematic interconnection of a radiation-emitting component according to FIGS. 1-6.
Figure 8:
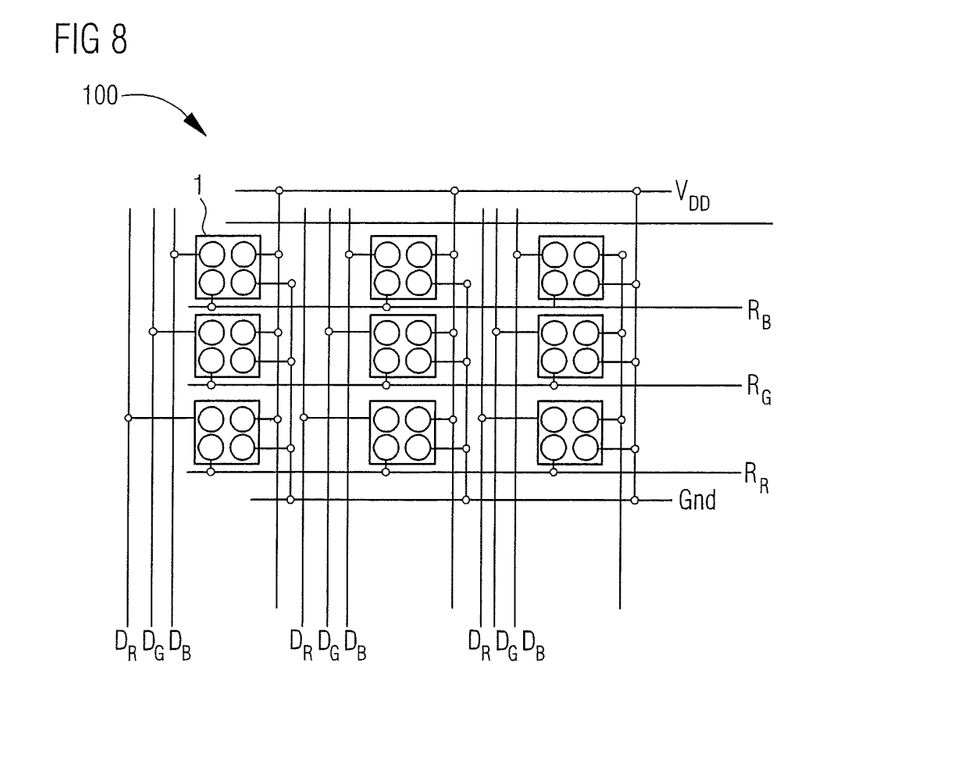
FIG. 8 shows a sixth example of a display device with radiation-emitting components according to FIGS. 1-6 in a schematic plan view.

To operate the component 1, an operating voltage can be applied between the first electrode 11 and the channel electrode 24, for example, by coupling with a first and second supply line $V_{DD}$, Gnd as shown in FIGS. 6-8, wherein the current flow I that controls the light-emitting operation can be adjusted by the voltage applied to the gate electrode 25.

Figure 3:
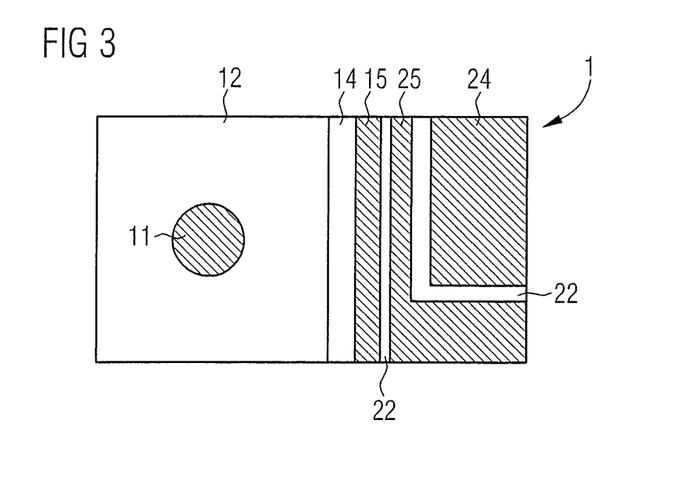
FIG. 3 shows the radiation-emitting component according to FIG. 2 in a schematic plan view.

In a third example as shown in FIG. 3, the component 1 according to FIG. 2 is shown in a plan view. The second semiconductor layer 14 has a lateral protrusion with respect to the first semiconductor layer 12 and the active region 13, the protrusion being at least partially covered by the second electrode 15. The second electrode 15, the gate electrode 25 and the channel electrode 24 are each laterally spaced from each other and separated by the gate layer 22.

Figure 4:
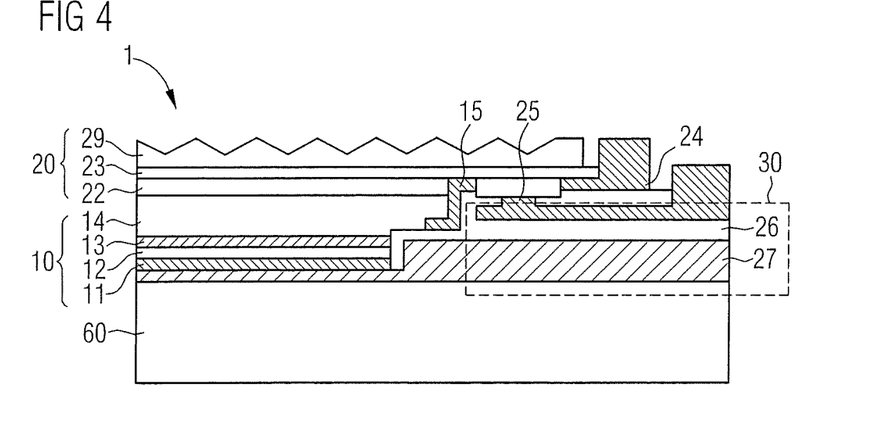
FIG. 4 shows a third example of a radiation-emitting component in a schematic sectional view.

FIG. 4 shows a third example of a radiation-emitting component 1 in a schematic sectional view. The component 1 differs from the second example in that the growth substrate 50 is removed and the stack with the FET 20 and the LED layer sequence 10 is arranged on a carrier 60. The buffer layer 29 has a roughened surface and forms the radiation exit surface of the component 1.

Moreover, between the carrier 60 and the first semiconductor layer 12, a solder 27 is inserted as an example, the solder contacting the first semiconductor layer 12 via the first electrode 11. The solder 27, for example, projects beyond the LED layer sequence 10 laterally and thus forms a capacitor 30 together with the gate electrode 25.

In this context, the gate electrode 25 exemplarily has a planar section that extends laterally across the channel electrode 24. Between the second electrode 15, the gate electrode 25 and the channel electrode 24 as well as between the solder 27 and the LED layer sequence 10, electrically insulating material of a dielectric 26 is arranged. This has a high dielectric constant, especially in the area of the capacitor 30. The dielectric 26, for example, contains $HfO_2$ in this area.

Figure 5:
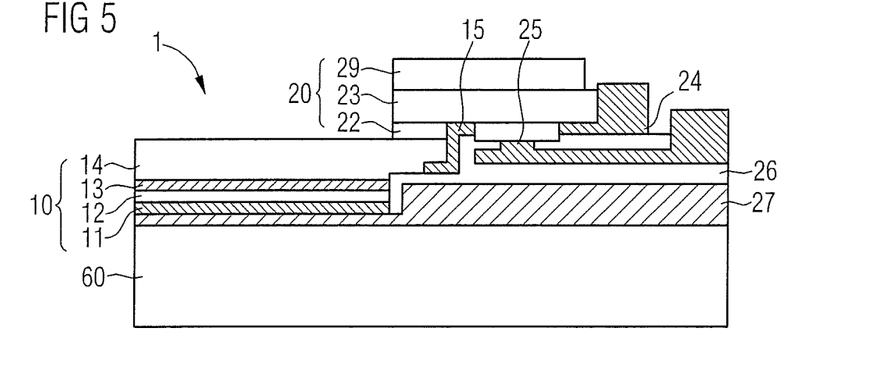
FIG. 5 shows a fourth example of a radiation-emitting component in a schematic sectional view.

In a fourth example as shown in FIG. 5, the component 1 differs from the third example in its materials and in the structuring of the FET 20. The LED layer sequence 10 is exemplarily configured to generate red light. In this context, the FET 20 is preferably based on GaAs/AlGaAs. The gate layer 22, the channel layer 23 and the buffer layer 29 are ablated in an area above the LED layer sequence 10, for example, by etching to avoid absorption of emitted radiation by the FET 20.

In the previous examples, only one FET 20 is provided, which serves as the driver for the LED layer sequence 10 (referred to as the driver FET). To ensure active matrix operation of the component 1, a second FET 40 (referred to as the switching FET) can be integrated into the component 1, for example, in the same process step.

In a fifth example as shown in FIG. 6, a schematic perspective view of a radiation-emitting component 1 is supplemented by a switching FET 40 and an external circuit compared to the second example. The switching FET 40 is arranged laterally adjacent to the driver FET 20 and has a common buffer layer 29. The channel layer 23 and the gate layer 22 are separated by a first trench. Another trench extends laterally between the channel layer 23 and the gate layer 22 of the switching FET 40 and the LED layer sequence 10. The dotted electron gas 28 (2 DEG) is also interrupted by the trenches. The channel layer 23 of the switching FET 40 is separately electrically contacted by a first and a second switching channel electrode 41, 44. The gate layer 22 of the switching FET 40 is electrically contacted by a switching gate electrode 45.

For reasons of clarity, the capacitor 30 is only shown schematically and can be realized according to FIG. 4 and integrated into component 1. For the same reasons, the interconnection of the FETs 20, 40 is only shown schematically and can be realized by introducing suitable rewiring levels. The interconnection is explained in more detail in FIG. 7.

For example, the component 1 is coupled with its first electrode 11 to a first connecting line $V_{DD}$, to which, for example, an operating potential is applied, and its driver channel electrode 24 is coupled to a second connecting line Gnd, to which, for example, ground potential is applied. The driver gate electrode 25 is coupled via the capacitor 30 to the first electrode 11 and directly to the second switching channel electrode 44. The first switching channel electrode 41 is coupled to a data line D to which a potential is applied which corresponds to a brightness to be set in radiation-emitting operation of the component 1. The switching gate electrode 45 is coupled to a switching line R which carries an alternating potential with which the voltage applied to the data line D can be switched through to the driver gate electrode 25 at regular intervals.

The interconnection of the component 1 as shown in FIG. 7 may in particular be part of a display device 100 comprising a plurality of such radiation-emitting components arranged in a matrix. FIG. 8 shows a seventh example of such a display device 100 in a plan view. The components 1 are each coupled with the supply lines $V_{DD}$, Gnd according to FIG. 6. Each column of the display device 100 exemplarily comprises three data lines $D_R$, $D_G$, $D_B$ that set an intensity value of one of the colors red (R), green (G) and blue (B) each. In addition, each row of the display device 100 comprises a switching line $R_R$, $R_G$, $R_B$ to regularly update the intensity values per row.

A video wall can, for example, have several such display devices 100 arranged next to each other as modules, each comprising a specified number of components 1. Advantageously, the integration of the field-effect transistors and possibly also the capacitor in the individual components 1 enables an active matrix operation of the video wall without the integration of silicon thin-film technology.

My components and methods are not limited to the examples by the description using the same. Rather, this disclosure includes any new feature and any combination of features, which in particular includes any combination of features in the appended claims, even if the feature or combination itself is not explicitly mentioned in the claims or examples.

This application claims priority of DE 10 2017 111 602.8, the subject matter of which is incorporated herein by reference.

The invention claimed is:

1. A radiation-emitting component comprising:
   at least one semiconductor layer sequence, at least one first and at least one second electrode and at least one driver field-effect transistor, at least one driver channel electrode and at least one driver gate electrode, wherein
   the semiconductor layer sequence comprises at least one first semiconductor layer, at least one second semiconductor layer and at least one active region that generates electromagnetic radiation and is arranged between the first and second semiconductor layers,
   the first electrode electrically connects to the first semiconductor layer and the second electrode electrically connects to the second semiconductor layer,
   the semiconductor layer sequence is configured to generate electromagnetic radiation depending on a current flow between the first and second electrodes,
   the driver field-effect transistor comprises at least one driver gate and at least one driver channel,
   the second electrode and the driver channel electrode separately electrically connect to the driver channel and the driver gate electrode electrically connects to the driver gate,
   the driver field-effect transistor is configured to control a current flow between the driver channel electrode and the second electrode through the driver channel and thereby the current flow between the first and second electrodes, depending on a voltage applied to the driver gate electrode, and
   the radiation-emitting component comprises a switching field-effect transistor, and the semiconductor layer sequence, the driver field-effect transistor and the switching field-effect transistor form a monolithic unit.

2. The radiation-emitting component according to claim 1, further comprising at least one capacitor electrode electrically insulated from the driver gate electrode and arranged such that the capacitor electrode forms, together with the driver gate electrode, a capacitor having a predetermined electrical capacitance.

3. The radiation-emitting component according to claim 2, wherein the capacitor electrode electrically connects to or is formed by the first electrode.

4. The radiation-emitting component according to claim 2, wherein a dielectric is arranged between the capacitor electrode and the driver gate electrode.

5. The radiation-emitting component according to claim 4, wherein the dielectric comprises or consists of a high-k dielectric.

6. The radiation-emitting component according to claim 2, wherein the switching field-effect transistor is configured to control a charging process of the capacitor, depending on the voltage applied to the switching gate electrode.

7. The radiation-emitting component according to claim 2, wherein the capacitor electrode is spaced from the driver gate electrode in a vertical direction, and the capacitor formed thereby, together with the driver field-effect transistor and the semiconductor layer sequence, form a monolithic unit and are integrated jointly into the radiation-emitting component.

8. The radiation-emitting component according to claim 1, further comprising at least one switching gate electrode, and at least one first and at least one second switching channel electrode, wherein
   the switching field-effect transistor comprises at least one switching gate and at least one switching channel,
   the first and second switching channel electrodes separately electrically connect to the switching channel and the switching gate electrode electrically connects to the switching gate,
   the second switching channel electrode electrically connects to the driver gate electrode, and
   the switching field-effect transistor is configured to switch a voltage applied to the first switching channel electrode through to the second switching channel electrode, depending on a voltage applied to the switching gate electrode.

9. The radiation-emitting component according to claim 1, wherein the driver field-effect transistor and/or the switching field-effect transistor is a junction field-effect transistor.

10. The radiation-emitting component according to claim 1, wherein the semiconductor layer sequence or the active region is based on at least one of: $Al_x In_y Ga_{1-x-y} N$, $Al_x In_y Ga_{1-x-y} P$ and $Al_x In_y Ga_{1-x-y} As$, each with $0 \leq x \leq 1$, $0 \leq y \leq 1$ and $x+y \leq 1$.

11. The radiation-emitting component according to claim 1, wherein the driver field-effect transistor and/or the switching field-effect transistor is based on at least one of: $Al_x Ga_{1-x-y} N$, $In_y Ga_{1-x-y} P$, $Al_x Ga_{1-x-y} As$, each with $0 \leq x \leq 1$, $0 \leq y \leq 1$ and $x+y \leq 1$.

12. The radiation-emitting component according to claim 1, wherein
   the semiconductor layer sequence or the active region contains or consists of $Al_x In_y G_{1-x-y} N$, and
   the driver field-effect transistor and/or the switching field-effect transistor contains or consists of $Al_x Ga_{1-x} N$, each with $0 \leq x \leq 1$, $0 \leq y \leq 1$ and $x+y \leq 1$.

13. The radiation-emitting component according to claim 1, wherein
   the semiconductor layer sequence or the active region contains or consists of $Al_x In_y Ga_{1-x-y} P$, and
   the driver field-effect transistor and/or the switching field-effect transistor contains or consists of $Al_x Ga_{1-x} As$, each with $0 \leq x \leq 1$, $0 \leq y \leq 1$ and $x+y \leq 1$.

14. The radiation-emitting component according to claim 1, wherein
   the semiconductor layer sequence or the active region contains or consists of $Al_x In_y Ga_{1-x-y} P$, and
   the driver field-effect transistor and/or the switching field-effect transistor contains or consists of $Al_x In_y Ga_{1-x-y} P$, each with $0 \leq x \leq 1$, $0 \leq y \leq 1$ and $x+y \leq 1$.

15. The radiation-emitting component according to claim 1, wherein the driver field-effect transistor and/or the switching field-effect transistor is structured such that no material of the driver field-effect transistor and the switching field-effect transistor is present perpendicular to the main extension direction of the semiconductor layer sequence.

16. The radiation-emitting component according to claim 1, wherein the radiation-emitting component is an LED.

17. The radiation-emitting component according to claim 1, wherein the semiconductor layer sequence and the driver field-effect transistor are epitaxially deposited on a common growth substrate, the semiconductor layer sequence and the driver field-effect transistor being grown in a stacked manner on top of one another at least in places.

18. The radiation-emitting component according to claim 1, wherein the second semiconductor layer has a lateral protrusion with respect to the first semiconductor layer and the active region, said protrusion being at least partially covered by the second electrode.

19. A display device comprising a plurality of radiation-emitting components arranged in rows and columns in a matrix comprising one data line per column and one switching line per row, and a first and second supply line, wherein each of the radiation-emitting components comprises:

at least one semiconductor layer sequence, at least one first and at least one second electrode and at least one driver field-effect transistor, at least one driver channel electrode and at least one driver gate electrode, wherein the semiconductor layer sequence comprises at least one first semiconductor layer, at least one second semiconductor layer and at least one active region that generates electromagnetic radiation and is arranged between the first and second semiconductor layers, the first electrode electrically connects to the first semiconductor layer and the second electrode electrically connects to the second semiconductor layer, the semiconductor layer sequence is configured to generate electromagnetic radiation depending on a current flow between the first and second electrodes, the driver field-effect transistor comprises at least one driver gate and at least one driver channel, the second electrode and the driver channel electrode separately electrically connect to the driver channel and the driver gate electrode electrically connects to the driver gate, and the driver field-effect transistor is configured to control a current flow between the driver channel electrode and the second electrode through the driver channel and thereby the current flow between the first and second electrodes, depending on a voltage applied to the driver gate electrode, and wherein each of the radiation-emitting components is electrically coupled to the respective switching line by its switching gate electrode, the respective data line by its first switching channel electrode, the first supply line by its first electrode, and the second supply line by its driver channel electrode.

20. A radiation-emitting component comprising:

at least one semiconductor layer sequence, at least one first and at least one second electrode and at least one driver field-effect transistor, at least one driver channel electrode and at least one driver gate electrode, wherein the semiconductor layer sequence comprises at least one first semiconductor layer, at least one second semiconductor layer and at least one active region that generates electromagnetic radiation and is arranged between the first and second semiconductor layers, the first electrode electrically connects to the first semiconductor layer and the second electrode electrically connects to the second semiconductor layer, the semiconductor layer sequence is configured to generate electromagnetic radiation depending on a current flow between the first and second electrodes, the driver field-effect transistor comprises at least one driver gate and at least one driver channel, the second electrode and the driver channel electrode separately electrically connect to the driver channel and the driver gate electrode electrically connects to the driver gate, and the driver field-effect transistor is configured to control a current flow between the driver channel electrode and the second electrode through the driver channel and thereby the current flow between the first and second electrodes, depending on a voltage applied to the driver gate electrode, and comprising at least one capacitor electrode electrically insulated from the driver gate electrode and arranged such that the capacitor electrode forms, together with the driver gate electrode, a capacitor having a predetermined electrical capacitance.

\* \* \* \* \*

UNITED STATES PATENT AND TRADEMARK OFFICE
CERTIFICATE OF CORRECTION

PATENT NO. : 11,011,573 B2  
APPLICATION NO. : 16/608455  
DATED : May 18, 2021  
INVENTOR(S) : Zeisel Page 1 of 1

It is certified that error appears in the above-identified patent and that said Letters Patent is hereby corrected as shown below:

In the Claims

<u>In Column 14</u>  
At Lines 38 to 39 Claim 11:  
Please change "$Al_x Ga_{1-x-y} N, In_y Ga_{1-x-y} P, Al_x Ga_{1-x-y} As,$" to -- $Al_x Ga_{1-x} N, Al_x In_y Ga_{1-x-y} P, Al_x Ga_{1-x} As,$ --.

Signed and Sealed this  
Third Day of August, 2021

Drew Hirshfeld  
*Performing the Functions and Duties of the*  
*Under Secretary of Commerce for Intellectual Property and*  
*Director of the United States Patent and Trademark Office*